United States Patent [19]
Mizunaga

[11] Patent Number: 6,064,256
[45] Date of Patent: May 16, 2000

[54] HIGH FREQUENCY MULTI-STAGE CAPACITIVELY COUPLED AMPLIFIER CIRCUITS

[75] Inventor: Sunao Mizunaga, Tokyo, Japan

[73] Assignee: Oki Electric Industry Co., Ltd., Tokyo, Japan

[21] Appl. No.: 08/947,354

[22] Filed: Oct. 8, 1997

[30] Foreign Application Priority Data

Oct. 14, 1996 [JP] Japan ................................. 8-271164

[51] Int. Cl.[7] ...................................................... H03F 3/68
[52] U.S. Cl. .......................... 330/2; 330/310; 330/145
[58] Field of Search .............................. 330/2, 144, 145, 330/252, 310, 110, 150, 311

[56] References Cited

U.S. PATENT DOCUMENTS 4,086,432   4/1978   Jones ..................................... 330/110 X Primary Examiner—Steven J. Mottola
Attorney, Agent, or Firm—Venable; George H. Spencer; Norman N. Kunitz

[57] ABSTRACT

A coupling capacitor 21 is connected in parallel to a diode 23 between an output nord N1 of a differential amplifier circuit 10 and an input nord N3 of another differential amplifier circuit 50. In a test mode, when a test signal TC is applied to a test pad 43, a switch circuit 40 is turned on to shortcircuit a bias resistor 35 thus decreasing a bias potential at the input nord N3. This causes the diode 23 to switch on for amplifying a test low-frequency input signal IN with the differential amplifier circuit 10. By the action of the diode 23, an output of the differential amplifier circuit 10 is bypassed to the differential amplifier circuit 50. The two differential amplifier circuits 10 and 50 can thus be inspected substantially by examining an output signal OUT obtained through an output pad 56 of the differential amplifier circuit 50.

2 Claims, 3 Drawing Sheets

HIGH FREQUENCY MULTI-STAGE CAPACITIVELY COUPLED AMPLIFIER CIRCUITS

BACKGROUND OF THE INVENTION

The present invention relates to a semiconductor device including a multi-stage amplifier circuit composed of semiconductor integrated circuits (referred to as ICs hereinafter) and particularly, a function of inspecting high-frequency amplifier circuits capacitively coupled to each other.

In a step of production of ICs, a group of ICs formed on a semiconductor wafer are subjected to probing a process for inspecting the function of each circuit, with probes the touching pads of the circuit in order to find defective circuits. For this purpose, each IC is equipped with pads for connection to external input/output signals and a power source as well as the pads for the probing test.

FIG. 3 is a schematic diagram of a conventional semiconductor device including a multi-stage amplifier circuit composed of ICs.

The conventional semiconductor device has a pad 1 which is provided for receiving an input signal IN and connected to the input of an amplifier circuit 2. The output of the amplifier circuit 2 is connected to the input of another amplifier circuit 4 by a coupling capacitor 3 which blocks direct-current components. The output of the amplifier circuit 4 is connected to a pad 5 for releasing an output signal OUT. The two amplifier circuits 2 and 4 are connected to common pads 6 and 7 for a power supply. The output of the amplifier circuit 2 also extends to a test pad 8, while the input of the amplifier circuit 4 is joined to a test pad 9.

For the probing test, probes extending from a test system, not shown, are applied directly to the pads 1 and 5–9. The pads 6 and 7 are loaded by their probes with a source voltage and the pad 1 is supplied with the input signal IN. The pad 5 is coupled to a measuring instrument for detecting the output signal OUT which has been amplified by the amplifier circuits 2 and 4.

Such a probing test however has a limitation that the band of frequencies to be measured is rather low. More particularly, signals of a given frequency or lower (for example, 1 MHz) only can be measured by the system. In a semiconductor device designed for amplification of high-frequency signals of, e.g., 100 MHz, the frequency of less than 1 MHz causes the coupling capacitor 3 to increase in impedance, thus interrupting normal transmission of an output of the amplifier circuit 2 to the amplifier circuit 4.

For compensation, the pad 8 is connected to the output of the amplifier circuit 2 for monitoring the output of the amplifier circuit 2. Also, an extra input signal is introduced from the pad 9 to the amplifier circuit 4 for monitoring the output signal OUT released at the pad 5. In a traditional manner, the two amplifier circuits 2 and 4 are measured separately for inspecting the semiconductor device.

As the two amplifier circuit 2 and 4 joined by the coupling capacitor 3 have to be measured separately in the conventional semiconductor device, the inspection will be troublesome and time consumable.

Also, the separate inspection for the two amplifier circuits 2 and 4 requires the two test pads 8 and 9 for their respective amplifier circuits 2 and 4, hence increasing the overall size of the semiconductor IC device.

SUMMARY OF THE INVENTION

The present invention is developed in view of the foregoing disadvantages of conventional semiconductor devices and its object is to provide a novel, improved semiconductor device which can be inspected at a pre-delivery test with a simple manner and within a shorter period of time.

Another object of the present invention is to provide a novel, improved semiconductor device in which the number of pads used for the test is minimized and thus, the space requirement for IC pattern is reduced.

According to a first feature of the present invention for overcoming the disadvantages, a semiconductor device is provided comprising: a first and a second amplifier circuit having input and output terminals; a direct-current breaker connected between the output terminal of the first amplifier circuit and the input terminal of the second amplifier circuit for blocking a direct-current component of an output signal of the first amplifier circuit and transmitting an alternate-current component of the same; and a switch connected in parallel to the direct-current breaker and responsive to a given control signal for shortcircuiting the direct-current breaker.

In a common action of the semiconductor device, the alternate-component of the output signal of the first amplifier circuit is transmitted via the direct-current breaker to the input of the second amplifier circuit. In the test, the switch upon receiving the control signal is shortcircuited, thus allowing the output signal of the first amplifier circuit to bypass the breaker and run directly to the second amplifier circuit.

According to a second feature of the present invention, a semiconductor device is provided comprising: a first amplifier circuit; a direct-current breaker for blocking a direct-current component of an output signal of the first amplifier circuit and transmitting an alternate-current component of the same to an intermediate node; a switch connected in parallel to the direct-current breaker and responsive to a test signal for turning on to allow the output signal of the first amplifier circuit to bypass the direct-current breaker and run directly to the intermediate node, and a second amplifier circuit for receiving the signal from the intermediate node.

In the test, the switch upon receiving the test signal is turned on, thus allowing the output signal of the first amplifier circuit to bypass the breaker and run directly to the second amplifier circuit. In any non-test mode, the switch remains turned off, causing the alternate-current component of the output signal of the first amplifier circuit to be transmitted via the direct-current breaker to the second amplifier circuit.

According to a third feature of the present invention, a semiconductor device is provided comprising: a first amplifier circuit responsive to a source potential for amplifying an analog signal; a coupling capacitor for blocking a direct-component of an output signal of the first amplifier circuit and transmitting an alternate-current component of the same; a second amplifier circuit responsive to the source potential for amplifying and delivering an output signal of the coupling capacitor; a bias resistor having a first and a second resistance for dividing the source potential, which imposes a first bias potential to the input side of the second amplifier circuit when the first resistance is selected and a second bias potential, which is higher than the first bias voltage, when the second resistance is selected; a pad for supplying a test signal in the test operation of the first and second amplifier circuits; a switch circuit; and a diode.

The switch circuit is connected to the pad for turning on in response to the test signal in the test operation to set the bias resistor to the first resistance and for turning off in any non-test mode to set the bias resistor to the second resistance. The diode is a circuit element which is connected in parallel to the coupling capacitor for, when the first bias potential is loaded to the input side of the second amplifier circuit, turning on and thus allow the output signal of the first amplifier circuit to bypass the coupling capacitor and run directly to the input of the second amplifier circuit, and when the second bias potential is loaded, for remaining turned off.

In the test, the switch circuit upon receiving the test signal from the pad is turned on, thus setting the bias resistor to the first resistance. The first bias potential is hence loaded to the input side of the second amplifier circuit and causes the diode to switch on permitting the output signal of the first amplifier circuit to bypass the coupling capacitor and run directly to the second amplifier circuit. In the non-test mode, the switch circuit remains turned off, thus setting the bias resistor to the second resistance. The second bias potential, which is higher than the first bias potential, is hence loaded to the input side of the second amplifier circuit and causes the diode to switch off permitting the alternate-current component of the output signal of the first amplifier circuit to be transmitted via the coupling capacitor to the second amplifier circuit.

According to a fourth feature of the present invention, a semiconductor device is provided comprising: a first amplifier circuit responsive to a source potential for amplifying an analog signal; a coupling capacitor for blocking a direct-component of an output signal of the first amplifier circuit and transmitting an alternate-current component of the same; a second amplifier circuit responsive to the source potential for amplifying and delivering an output signal of the coupling capacitor; a load resistor having a first and a second resistance for attenuating the source potential to be applied to the first amplifier, which changes an output potential of the first amplifier to a first output potential when the first resistance is selected, and to a second output potential, which is lower than the first output potential, when the second resistance is selected; a pad for supplying a test signal in the test operation of the first and second amplifier circuits; a switch circuit; and a diode.

The switch circuit is connected to the pad for turning on in response to the test signal in the test operation to set the load resistor to the first resistance and for turning off in any non-test mode to set the load resistor to the second resistance. The diode is a circuit element which is connected in parallel to the coupling capacitor for, when the first output potential is loaded to the output side of the first amplifier circuit, turning on thus to allow the output signal of the first amplifier circuit to bypass the coupling capacitor and run directly to the input of the second amplifier circuit, and when the second output potential is loaded, for remaining turned off.

In the test, the switch circuit upon receiving the test signal from the pad is turned on thus setting the load resistor to the first resistance. The first output potential is hence loaded to the output side of the first amplifier circuit and causes the diode to switch on permitting the output signal of the first amplifier circuit to bypass the coupling capacitor and run directly to the second amplifier circuit. In the non-test mode, the switch circuit remains turned off, thus setting the load resistor to the second resistance. The second output potential which is higher than the first output potential is hence loaded to the output side of the first amplifier circuit and causes the diode to switch off. As the result, the alternate-current component of the output signal of the first amplifier circuit can be transmitted via the coupling capacitor the second amplifier circuit.

BRIEF DESCRIPTION OF THE DRAWINGS

The above and other features of the Invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PRESENT INVENTION

Preferred embodiments of a semiconductor device according to the present invention will be described referring to the accompanying drawings.

First Embodiment

Figure 1:
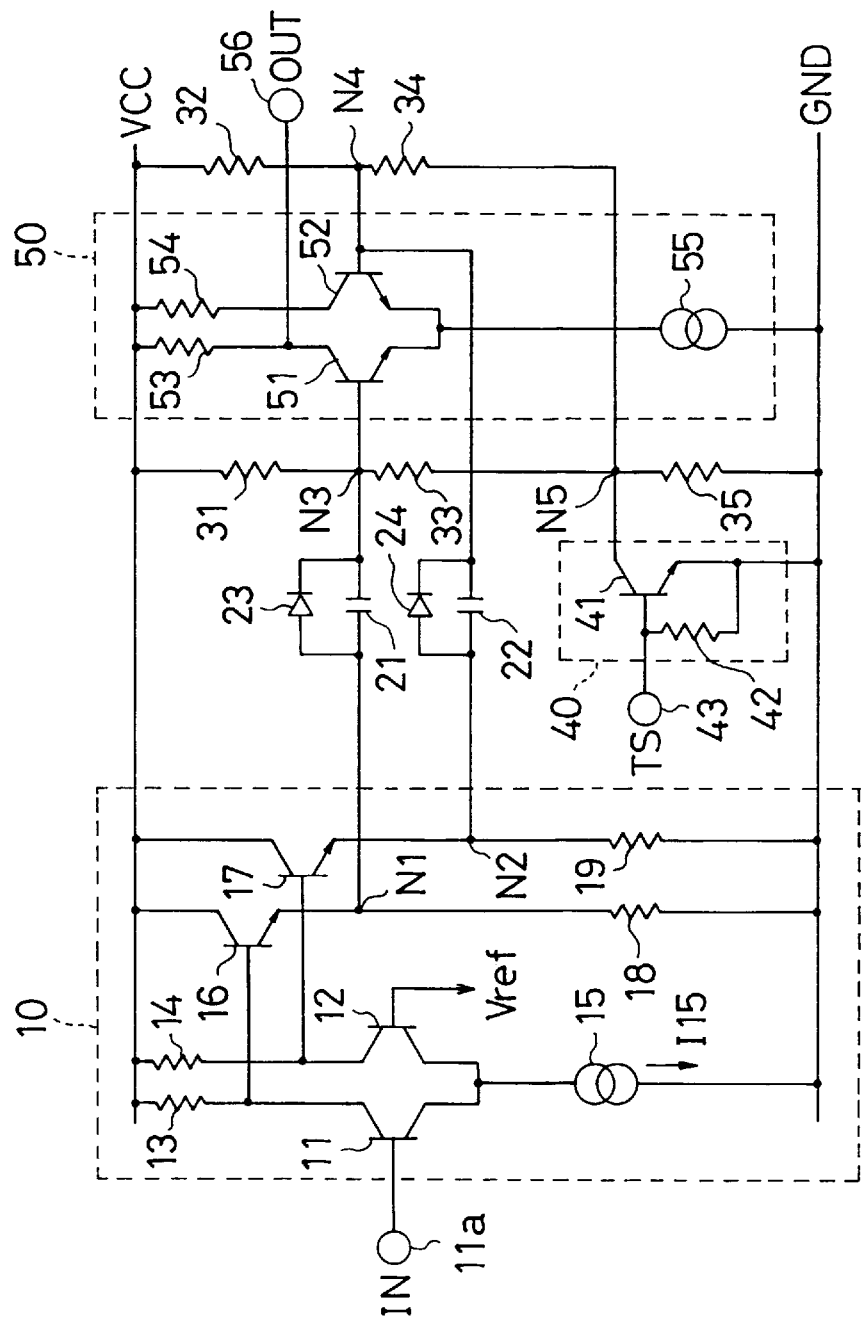
FIG. 1 is a circuit diagram of a semiconductor device showing a first embodiment of the present invention.

FIG. 1 is a circuit diagram of a semiconductor device including high-frequency amplifiers capacitively coupled to each other, showing a first embodiment of the present invention.

The semiconductor device of the embodiment comprises an analog IC pattern developed on a semiconductor substrate and including a first amplifier circuit (namely, a differential amplifier circuit) 10. The differential amplifier circuit 10 comprises transistors 11, 12, 16, and 17, load resistors 13, 14, 18, and 19, and a constant current source 15. The base of the transistor 11 is connected to an input pad 11a for receiving an input signal IN. The base of the transistor 12 is connected to a reference voltage source (not shown) for feeding of a reference voltage Vref. The collectors of the two transistors 11 and 12 are connected by their respective load resistors 13 and 14 to a source potential VCC. The emitters of the transistors 11 and 12 are connected to a common grounding potential GND via the constant current source 15. The collectors of the two transistors 11 and 12 are also connected to the bases of the buffer transistors 16 and 17, respectively. The collectors of the transistors 16 and 17 are then connected to the source potential VCC. The emitters of the transistors 16 and 17 are both connected to the grounding potential GND via their respective load resistors 18 and 19, and are also connected to two output nodes N1 and N2, respectively, for releasing the output signal of the differential amplifier circuit 10.

The output nodes N1 and N2 are joined to corresponding ends of direct-current breakers (namely, a coupling capacitor) 21 and 22 respectively. The coupling capacitor 21 and 22 are connected at the other end to input nodes N3 and N4, respectively. The output nodes N1 and N2 are also connected with anodes of two switches (namely, diodes) 23 and 24. The cathodes of the diodes 23 and 24 are connected to the input nords N3 and N4 respectively.

The input nodes N3 and N4 are connected via bias resistors 31 and 32, respectively, to the source potential VCC and via bias resistors 33 and 34 respectively to a control node N5. A bias resistor 35 and a switch circuit 40 are connected in parallel between the control node N5 and the grounding potential GND.

The switch circuit 40 comprises a transistor 41 and a resistor 42 connected between the base and the emitter of the transistor 41. The collector of the transistor 41 is connected to the control node N5 and the emitter is joined to the grounding potential GND. Also, the base of the transistor 41 is further connected to a test pad 43 for receiving a test signal TS.

The input nodes N3 and N4 are connected with a second amplifier circuit (namely, a differential amplifier circuit) 50.

The differential amplifier circuit 50 comprises transistors 51 and 52, load resistors 53 and 54, and a constant current source 55. The bases og transistors 51 and 52 are connected to the input nodes N3 and N4, respectively. The collectors of the two transistors 51 and 52 are connected via their respective load resistors 53 and 54 to the source potential VCC, while their emitters are both connected to the grounding potential GND via the constant current source 55. The collector of the transistor 51 is connected with an output pad 56 for releasing the output signal OUT.

The action of probing test (I) and the action of normal operation in package form (II) of the semiconductor device of the first embodiment is now explained.

(I) Probing Test

It is assumed that the circuit constants of the semiconductor device shown in FIG. 1 are:

Current I15 of constant current source 15=0.4 mA,

Resistance R13, R14 of resistors 13, 14=2 k$\Omega$,

Resistance R31, R32 of bias resistors 31, 32=3 k$\Omega$,

Resistance R33, R34 of bias resistors 33, 34=2 k$\Omega$,

Resistance R35 of bias resistor 35 =6 k$\Omega$, and

Base/emitter voltage VBE of transistors 16, 17=0.8 V.

When probes of a test system not shown are applied directly to the input pad 11a, the test pad 43, the output pad 56, and a source pad not shown of the semiconductor device shown in FIG. 1, the source pad is loaded with the source potential VCC of 5 volts D. C. The input signal IN which is, for example, a given DC level superimposed with an AC signal of 1 MHz is supplied to the input pad 11a. The test signal TS of 1 V which is high enough to switch on the transistor 41 is fed to the test pad 43.

Accordingly, the transistors 11 and 12 receive a DC balanced input or I15/2=0.2 mA. The average potentials VN1 and VN2 at the output nords N1 and N2 are thus expressed by:

$$VN1=VN2=VCC-R14\times I15/2-VBE=5-2\times 0.2-0.8=3.8 \text{ V} \quad (1)$$

The bias potentials VN3 and VN4 at the input nodes N3 and N4 when the diodes 23 and 24 are not connected and the transistor 41 remains turned on, are expressed by:

$$VN3=VN4=VCC\times R33/(R31+R33)=2V \quad (2)$$

Consequently, the potential difference VN13 between the output node N1 and the input node N3 and the potential difference VN24 between the output node N2 and the input node N4 are calculated from:

$$VN13=VN24=VN2-VN4=3.8-2=1.8V \quad (3)$$

The result of difference voltage from the equation (3) is high enough to provide a forward current for switching on the diodes 23 and 24. The switching on of the diodes 23 and 24 permits direct-current connection between the input node N1 and the output nord N3 and between the input nord N2 and the output node N4 respectively.

As the result, the input signal IN of 1 MHz is amplified by the amplifier circuit 10, is permitted by the action of the diodes 23 and 24 to bypass the coupling capacitors 21 and 22, and is transmitted to the differential amplifier circuit 50 where it is further amplified before being released from the output pad 56 as the output signal OUT. The output signal OUT is picked up with the probe applied to the output pad 56 and detected in, e. g., waveform by a measuring instrument (not shown) to check the action of the semiconductor device.

As the diodes 23 and 24 are switched on by the test signal supplied through the test pad 43, the two differential amplifier circuits 10 and 50 coupled to each other can substantially be inspected although the operating point may be lagged or advanced from its desired point. This will reduce the time and labor required for the probing test by almost one half.

In addition, a lesser number of the test pads are used as compared with separate inspection of the two differential amplifier circuits 10 and 50, hence minimizing the installation area for the IC device.

(II) Normal Operation

The IC devices which have passed the probing test are then cut to chips from the semiconductor wafer and mounted into casings. This is followed by joining the source pads and input/output pads of each IC chip to corresponding pins on the casing with wire bonding. Then, the casing is hermetically sealed with a cap to complete an IC package. In the wire bonding, the test pad 43 is not joined to any pin on the casing and remains isolated.

In the normal mode, the semiconductor device of FIG. 1 in the IC package form has the base of the transistor 41 connected via the resistor 42 to the grounding potential GND. Accordingly, the transistor 41 remains switched off and the bias voltages VN3 and VN4 at the input nodes N3 and N4 are expressed by:

$$VN3=VN4=VCC\times(R33+R35)/(R31+R33+R35)=3.63V \quad (4)$$

The average potentials VN1 and VN2 at the output nodes N1 and N2 are 3.8 V as calculated from the equation (1). Thus, the potential difference VN13 between the output node N1 and the input node N3 and VN24 between the output node N2 and the input node N4 are expressed by:

$$VN13=VN24=VN2-VN4=3.8-3.63\ 1=0.17V \quad (5)$$

Accordingly, the diodes 23 and 24 are disconnected, hence allowing the high-frequency signal of, e.g., 100 MHz to be transmitted from the differential amplifier circuit 10 via the coupling capacitors 21 and 22 to the differential amplifier circuit 50. As the result, the differential amplifier circuits 10 and 50 can be operated at the desired operating point regardless of the action of the diodes 23 and 24.

Second Embodiment

Figure 2:
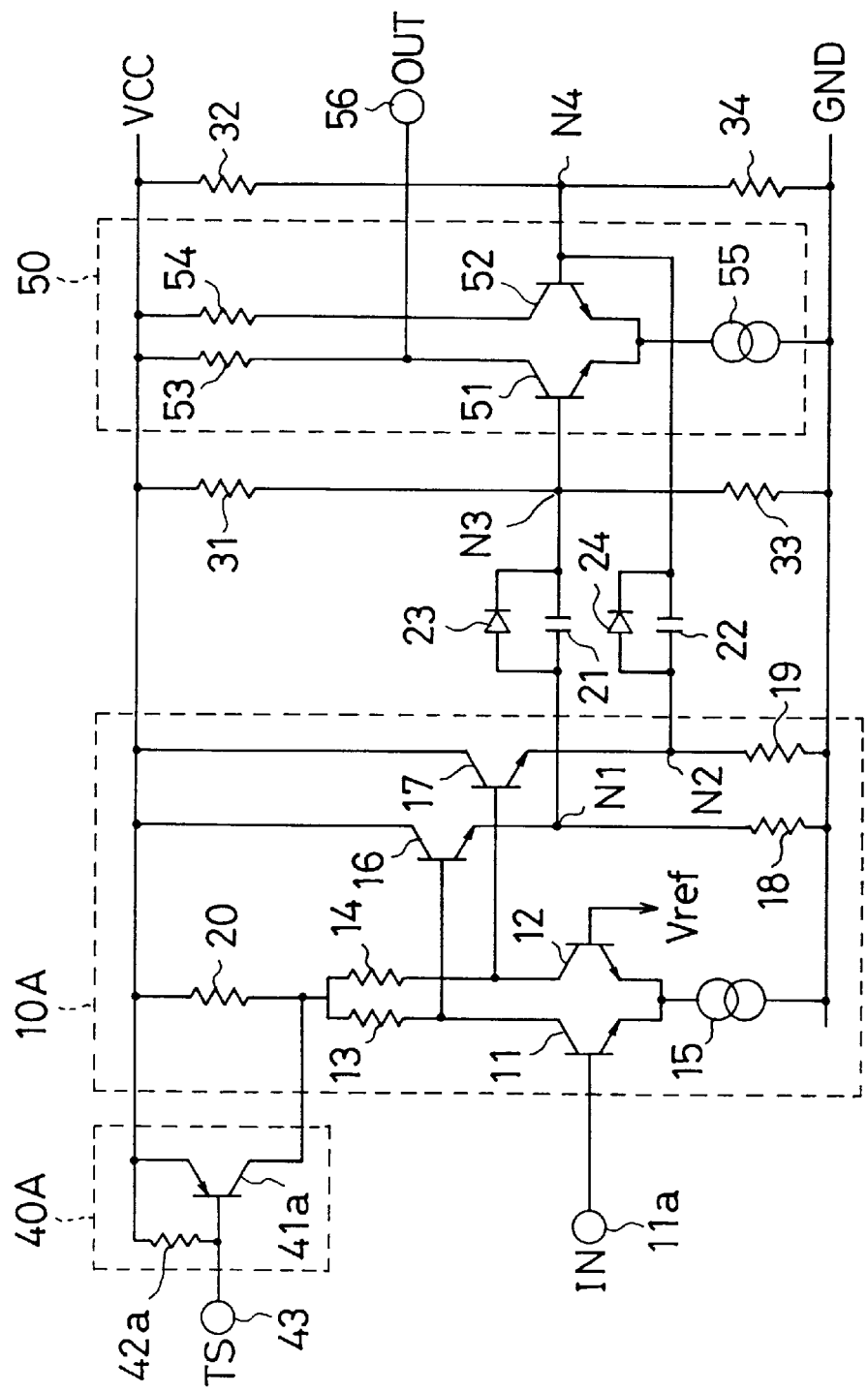
FIG. 2 is a circuit diagram of a semiconductor device showing a second embodiment of the present invention.
Figure 3:
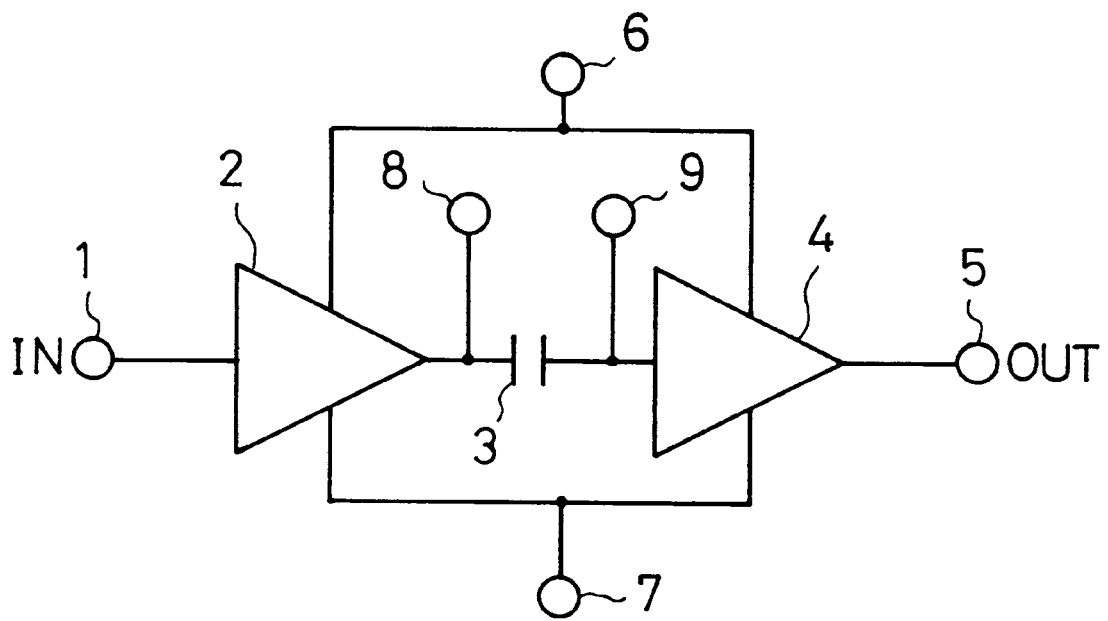
FIG. 3 is a diagram of a conventional semiconductor device.

FIG. 2 is a circuit diagram of another semiconductor device having high-frequency amplifier circuits capacitively coupled to each other, showing a second embodiment of the present invention in which like components are denoted by like numerals as those shown in FIG. 1.

The semiconductor device of the second embodiment, similar to that shown in FIG. 1, consists of an analog IC pattern developed on a semiconductor substrate but is distinguished by the following respects (i) to (iii).

(i) The differential amplifier circuit 10 is replaced by a differential amplifier circuit 10A of a differing construction. In the differential amplifier circuit 10A, two load resistors 13 and 14 for transistors 11 and 12 are connected to a common node N6 which is in turn joined by a load resistor 20 to a source VCC.

(ii) A switch circuit 40A is connected in parallel to the load resistor 20. The switch circuit 40A comprises a transistor 41a connected at its collector and emitter to both ends of the load resistor 20 and a resistor 42a connected between the base and the emitter of the transistor 41a. The base of the transistor 41a is also joined to a test pad 43.

(iii) While the switch circuit 40 and the resistor 35 shown in FIG. 1 are eliminated, the control node N5 is connected to the grounding potential GND.

The action of probing test in the semiconductor device shown in FIG. 2 is explained.

The test pad 43 is first supplied with a test signal ST which is identical in potential to the source potential VCC of 1 V. As the transistor 41a is switched on, the load resistor 20 is shortcircuited causing the potential at the control node N6 to rise to to a high level as the source potential VCC.

The rise of the potential at the control node N6 increases the potentials at the collectors of the transistors 11 and 12. As the potentials at the collectors of the transistors 11 and 12 are increased, the potentials at the bases of the transistors 16 and 17 soar. Accordingly, the output potentials at the output nodes N1 and N2 of the differential amplifier circuit 10A are increased. This permits the diodes 23 and 24 to receive forward voltages and turn on. As the result, a input signal IN amplified by the differential amplifier circuit 10a is permitted by the action of the diodes 23 and 24 to bypass the coupling capacitors 21 and 22 and run to the differential amplifier circuit 50.

In the semiconductor device of FIG. 2, similar to the device of the first embodiment shown in FIG. 1, the action of the two differential amplifier circuits 10A and 50 coupled to each other can substantially be inspected with the load resistors 13, 14, and 20 set to such resistance levels that the diodes 23 and 24 are switched on by the test signal TS applied through the test pad 43, although the operating points may be lagged or advanced from its desired point. Also, the semiconductor device of an IC package form shown in FIG. 2 is not loaded at the test pad 43 with the test signal TS when it is operated in the normal mode. Since the switch circuit 40A remains turned off, the control node N6 is connected via the load resistor 20 to the source potential VCC, lowering the output potentials at the output nodes N1 and N2 of the differential amplifier circuit 10A and causing the two diodes 23 and 24 to remain switched off. This allows the high-frequency signal of, e.g., 100 MHz to run from the differential amplifier circuit 10A through the coupling capacitors 21 and 22 to the differential amplifier circuit 50.

The semiconductor device of the second embodiment shown in FIG. 2 is different in the circuitry arrangement but identical in the advantageous function to the device of the first embodiment. This permits a choice from various circuitry arrangements in designing an IC pattern and provides versatility of the IC pattern design.

Although the foregoing description in conjunction with the accompanying drawings has been made with reference to the preferred embodiments, the present invention is not limited to the embodiments. It will be understood by those skilled in the art that various changes and modifications are possible without departing from the technical concepts defined in the appended claims as they fall in the scope of the present invention.

For example, the differential amplifier circuits 10 and 50 shown in FIGS. 1 and 2 are not limitations, and any type of the amplifier circuit may be used with equal success.

The amplifier circuit is not limited to such a two-stage amplifier circuit depicted in the embodiments and may incorporate three or more stages.

Although the switch circuit 40 shown in FIG. 1 is connected to the grounding potential GND, it may be connected to the source potential VCC. In case that the bias potentials at the input nodes N3 and N4 are lower than the output potentials at the output nodes N1 and N2, the switch circuit 40 may be connected to the source potential VCC with the diodes 23 and 24 coupled with their polarity reversed. Accordingly, the bias potential at the input nodes N3 and N4 will be increased in the probing test, hence providing the same effect as of the arrangement shown in FIG. 1.

The diodes 23 and 24 which serve as switches may be substituted by switching devices such as transistors responsive to the test signal TS for performing on/off actions.

The present invention is not limited to the described semiconductor device provided with high-frequency amplifier circuits but is applicable to a semiconductor device for low-frequency signals in case that the test signal of a probing test instrument is lower. As set forth above, the first and second features of the present invention provide a switch, which is turned on in the test operation and off in any non-test mode, connected in parallel to a direct-current breaker. Accordingly, the function of the first and second amplifier circuits can readily be inspected using a low-frequency signal which includes a DC component.

The third feature of the present invention provides a diode connected in parallel to a coupling capacitor for capacitive coupling the first and second amplifier circuits and a switch circuit for switching the resistance of a bias resistor to apply a bias voltage to the second amplifier circuit. Accordingly, the same function as of the first feature can be achieved by supplying a bias potential high enough to switch on the diode in the test operation.

The fourth feature of the present invention provides a diode connected in parallel to a coupling capacitor for capacitive coupling the first and second amplifier circuits and a switch circuit for switching the resistance of a load resistor to determine an output potential of the first amplifier circuit. Accordingly, the same function as of the first feature can be achieved by supplying an output potential high enough to switch on the diode in the test operation.

Throughout the first to fourth feature of the present invention, the test for inspecting the function of the semiconductor device is consistently performed thus reducing its overall time and contributing to the reduction of the number of test pads.

The entire disclosure of Japanese Patent Application No. 8-271164 filed on Oct. 14, 1996 including specification, claims, drawings and summary is incorporated herein by reference in its entirety.

What is claimed is:

1. A semiconductor device comprising:
    a first amplifier circuit responsive to a source potential for amplifying an analog signal;
    a coupling capacitor for blocking a direct-component of an output signal of the first amplifier circuit and transmitting an alternate-current component of the same;
    a second amplifier circuit responsive to the source potential for amplifying and delivering an output signal of the coupling capacitor;
    a bias resistor having a first and a second resistance for dividing the source potential, which imposes a first bias potential to the input side of the second amplifier circuit when the first resistance is selected and a second bias potential, which is higher than the first bias potential, when the second resistance is selected;
    a pad for supplying a test signal in the test operation of the first and second amplifier circuits;
    a switch circuit connected to the pad for turning on in response to the test signal in the test operation to set the bias resistor to the first resistance and turning off in any non-test mode to set the bias resistor to the second resistance; and
    a diode connected in parallel to the coupling capacitor for, when the first bias potential is loaded to the input side of the second amplifier circuit, turning on thus to allow the output signal of the first amplifier circuit to bypass the coupling capacitor and run directly to the input of the second amplifier circuit and when the second bias potential is loaded, for remaining turned off.

2. A semiconductor device comprising:

a first amplifier circuit responsive to a source potential for amplifying an analog signal;

a coupling capacitor for blocking a direct-component of an output signal of the first amplifier circuit and transmitting an alternate-current component of the same;

a second amplifier circuit responsive to the source potential for amplifying and delivering an output signal of the coupling capacitor;

a load resistor having a first and a second resistance for attenuating the source potential to be applied to the first amplifier, which changes an output potential of the first amplifier to a first output potential when the first resistance is selected, and to a second output potential, which is lower than the first output potential, when the second resistance is selected;

a pad for supplying a test signal in the test operation of the first and second amplifier circuits;

a switch circuit, connected to the pad for turning on in response to the test signal in the test operation to set the load resistor to the first resistance and for turning off in any non-test mode to set the load resistor to the second resistance; and a diode connected in parallel to the coupling capacitor for, when the first output potential is loaded to the output side of the first amplifier circuit, turning on thus to allow the output signal of the first amplifier circuit to bypass the coupling capacitor and run directly to the second amplifier circuit and when the second output potential is loaded, remaining turned off.

* * * * *